United States Patent
Paulraj et al.

(10) Patent No.: US 11,036,406 B2
(45) Date of Patent: Jun. 15, 2021

(54) THERMALLY AWARE MEMORY MANAGEMENT

(71) Applicant: International Business Machines Corporation, Armonk, NY (US)

(72) Inventors: Girisankar Paulraj, Bangalore (IN); Daniel Lewis, Bangalore (IN); Sumantra Sarkar, Bangalore (IN); Arindam Raychaudhuri, Kodihalli (IN); Diyanesh B. Chinnakkonda Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/417,746

(22) Filed: May 21, 2019

(65) Prior Publication Data

US 2020/0371699 A1   Nov. 26, 2020

(51) Int. Cl.
*G11C 7/04* (2006.01)
*G06F 3/06* (2006.01)
*G11C 29/12* (2006.01)
*G06F 9/445* (2018.01)

(52) U.S. Cl.
CPC .......... *G06F 3/0631* (2013.01); *G06F 3/0604* (2013.01); *G06F 3/0644* (2013.01); *G06F 3/0653* (2013.01); *G06F 3/0673* (2013.01); *G06F 9/44505* (2013.01); *G11C 29/12* (2013.01)

(58) Field of Classification Search
CPC .... G06F 3/0631; G06F 3/0673; G06F 3/0604; G06F 3/0653; G06F 3/0644; G06F 9/44505; G06F 3/122; G06F 3/1204; G06F 3/1257; G06F 9/45533; G06F 12/0253; G06F 2212/1044; G06F 2212/1041; G06F 12/1036; G06F 12/109; G06F 9/455; G11C 29/12; G11C 2029/5002; G11C 29/50; G11C 7/04; H04N 1/0097; H04N 2201/0094
USPC ......................................................... 714/718
See application file for complete search history.

(56) References Cited

U.S. PATENT DOCUMENTS

| | | | | |
|---|---|---|---|---|
| 7,188,282 B2 * | 3/2007 | Walmsley | ............ | B41J 2/04505 714/718 |
| 7,404,124 B2 * | 7/2008 | Martin | .................. | G11C 29/48 324/762.02 |
| 7,587,559 B2 | 9/2009 | Brittain | | |
| 7,730,375 B1 * | 6/2010 | Russell | .................. | G11C 29/46 714/733 |
| 7,797,506 B2 | 9/2010 | Rangarajan | | |

(Continued)

OTHER PUBLICATIONS

Mell et al., "The NIST Definition of Cloud Computing", Recommendations of the National Institute of Standards and Technology, Special Publication 800-145, Sep. 2011, 7 pages.

*Primary Examiner* — Albert Decady
*Assistant Examiner* — Enam Ahmed
(74) *Attorney, Agent, or Firm* — David K. Mattheis; William H. Hartwell; Nicholas L. Cadmus

(57) ABSTRACT

Managing system memory allocation according to a thermal profile defining memory segment policies according to power, performance, and thermal requirements, selecting a defined memory segment policy, implementing a system workload according to the memory segment policy and deploying the system workload according to the implemented memory segment policy.

17 Claims, 6 Drawing Sheets

(56) References Cited

U.S. PATENT DOCUMENTS

| | | | |
|---|---|---|---|
| 9,361,195 B2 | 6/2016 | Chinnakkonda Vidyapoornachary | |
| 9,734,204 B2* | 8/2017 | Chamberlain | G06F 11/36 |
| 10,789,178 B2* | 9/2020 | Kinzinger | G06F 9/35 |
| 2002/0129172 A1* | 9/2002 | Baskey | G06F 9/544 719/310 |
| 2011/0134069 A1* | 6/2011 | Shen | G06F 3/045 345/174 |
| 2013/0275665 A1 | 10/2013 | Saraswat | |
| 2014/0005963 A1* | 1/2014 | Dawley | G01R 19/2513 702/60 |
| 2014/0020112 A1* | 1/2014 | Goodes | G06F 9/5016 726/26 |
| 2014/0281311 A1 | 9/2014 | Walker | |
| 2014/0328132 A1* | 11/2014 | Cordero | G11C 29/028 365/200 |
| 2016/0041906 A1* | 2/2016 | Mukherjee | G06F 16/2379 711/119 |
| 2016/0127440 A1* | 5/2016 | Gordon | H04N 21/23439 709/219 |
| 2016/0371101 A1* | 12/2016 | Beale | G06F 12/08 |
| 2018/0217750 A1* | 8/2018 | Nguyen | G06F 9/5016 |
| 2019/0087225 A1* | 3/2019 | Rozen | G06F 9/4881 |
| 2019/0215133 A1* | 7/2019 | Pan | H04L 1/0061 |

\* cited by examiner

THERMALLY AWARE MEMORY MANAGEMENT

BACKGROUND

The disclosure relates generally to managing computer system memory usage. The disclosure relates particularly to managing system memory resource according to memory component thermal profiles.

Typical computer systems include a memory controller to facilitate processor and input/output (I/O) access to the system memory segments. The memory controller gives up control of memory access to the system operating system (OS). The OS has a memory allocator which manages virtual address (VA) space. A hypervisor includes a real address space allocator. When an application requires new memory, a system call is executed explicitly requesting new memory. The OS then allocates a VA memory segment for the requested memory. The allocation can be based upon available addresses in the VA space.

Increasing circuit element density within memory segments can lead to non-uniform thermal zones in operating system memory segments. Demands upon system cooling subsystems increase in tandem with memory circuit element density.

SUMMARY

Aspects of the invention disclose methods, systems and computer readable media associated with managing system memory allocation according to a thermal profile include defining memory segment policies according to power, performance, and thermal requirements, selecting a defined memory segment policy, implementing a system workload according to the memory segment policy and deploying the system workload according to the implemented memory segment policy.

DETAILED DESCRIPTION

Figure 1:
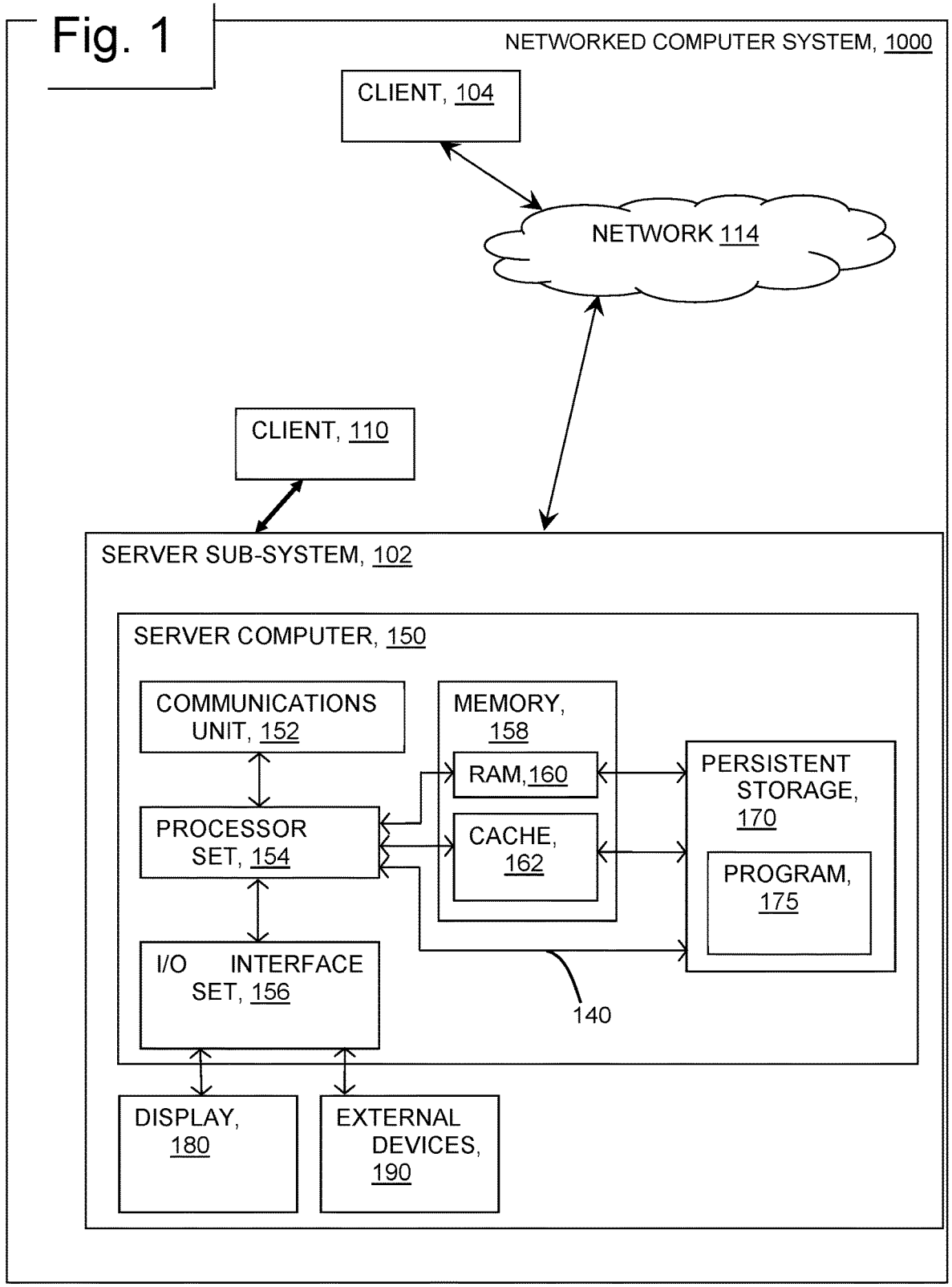
FIG. 1 provides a schematic illustration of a system, according to an embodiment of the invention.

Increasing memory element density and higher system clock rates can lead to thermal imbalances in memory segments such as dual, in-line, memory modules (DIMMs). Hot spots can form in the set of DIMMs requiring additional energy to be expended to cool the system. What is needed is a way to manage memory allocation to reduce the formation of hot spots without reducing system performance.

In an embodiment, a set of system DIMMs is analyzed to create a map of thermal zones of the set. The thermal map can then be used by the OS in the allocation of pages to memory to reduce the formation of thermal hot spots in the set. In this embodiment, a system user can define acceptable limits on the temperature differences between mapped thermal zones, and also define desired system performance versus thermal profiling.

In an embodiment, during initial program load (IPL) a memory controller built in self-test (MCBIST) routine is run to generate data traffic to and from the system memory elements. The MCBIST is run to generate traffic for a selected memory segment, such as a single DIMM. In an embodiment, the generated traffic comprises a single memory rank. In an embodiment, the traffic comprises a set of differing memory ranks. The set of differing memory ranks are swizzled (mixed) to more closely simulate actual system operating conditions.

Concurrent with running the MCBIST directed at the selected memory segment, additional traffic is generated and directed toward all other system memory segments. This additional traffic is used to simulate worst case operating conditions for the selected segment. The additional traffic is generated using MCBIST directed at the other segments.

Concurrent with generating data traffic across the set of system DIMMs, the temperature of the selected DIMM is measured. Temperature measurement can be accomplished using distributed temperature sensing (DTS) using optical fiber temperature sensors, or thermal diodes, incorporated into the system for this purpose. Segment temperatures can be recorded and mapped for varying system cooling levels. In an embodiment, temperatures are recorded/mapped for minimum, maximum and average cooling system performance and air-flow levels. In an embodiment, temperatures are recorded/mapped for cooling system levels ranging from the minimum to the maximum in intervals selected by the user. The user selects 2, 3, 4, 5, or more intervals to segment the temperature/cooling system performance data for the thermal zone mapping.

In an embodiment, thermal zones are mapped according to temperature differences between adjacent memory segment portions as the generated traffic occurs, with additional consideration for the memory bandwidth, and memory channel interleave extent. Each system memory segment may be selected in turn, with traffic generation and temperature mapping undertaken for each segment. In an embodiment, all segments may be concurrently analyzed and thermally mapped as described above. In this embodiment, thermal zones are created in part based upon historical execution data—allocated memory segments depending upon workload execution and the accompanying temperature profile. The thermal mapping of the memory groupings is provided to the OS.

Table 1 illustrates a system mapping according to an embodiment of the invention. The table provides minimum (T min), average (Tavg), and maximum (T max) temperature data for selected memory grouping at minimum (2 kHz), average (4 kHz), and maximum (6 kHz), cooling fan speeds and minimum, average and maximum data traffic levels.

TABLE 1

| Memory Grouping | Fan Speed 2 kHz | | | Fan Speed 4 kHz | | | Fan Speed 6 kHz | | |
|---|---|---|---|---|---|---|---|---|---|
| | Tmin | Tavg | Tmax | Tmin | Tavg | Tmax | Tmin | Tavg | Tmax |
| 1 | 30 | 35 | 40 | 40 | 45 | 50 | 50 | 55 | 60 |
| 2 | 40 | 45 | 50 | 50 | 55 | 60 | 60 | 65 | 70 |
| 3 | 50 | 55 | 60 | 60 | 65 | 70 | 70 | 75 | 80 |
| ... | | | | | | | | | |

In an embodiment, memory group 1, under any fan speed, together with memory group 2 at the minimum fan speed, may be defined as zone 1 satisfying user settings for power consumption, and memory temperature differential. Memory grouping 2 at average or maximum fan speeds, together with memory grouping 3 at the minimum fan speed is defined as zone 2 memory according to the user settings. Memory grouping 3 at average or maximum fan setting is designated as zone 3 memory.

In an embodiment, the user setting includes trade-offs between power consumption and acceptable memory grouping temperature differential. In an embodiment, a user may select a temperature differential of up to 20 at low power consumption for zone 1, a differential of 30 at low power consumption or 20 at average or maximum power consumption for zone 2, and a differential of 30 at average or maximum power consumption for zone 3.

Table 2 provide power consumption and performance data for the respective zones.

TABLE 2

| Memory B) | Power Consumption | | Memory Bandwidth in GB | | | Zone |
|---|---|---|---|---|---|---|
| | Pmin | Pmax | Min | Avg | Max | |
| 32 GB | 50 | 75 | 2.5 | 3 | 3.5 | 1 |
| 64 GB | 50 | 100 | 3 | 4 | 5 | 1 |
| 128 GB | 50 | 125 | 10 | 12 | 14 | 2 |
| 256 GB | 75 | 150 | 20 | 25 | 30 | 2 |
| 512 GB | 75 | 200 | 40 | 50 | 60 | 3 |
| 1 TB | 100 | 200 | 80 | 100 | 120 | 3 |

As illustrated by the table 2 data, zone 1 memory consumes less power but offers less memory bandwidth and less memory capacity than zone 2, and zone 3 offers the greatest bandwidth and capacity at a higher power consumption than zone 1 or 2.

In an embodiment, a user can specify their memory allocation preferences in terms of power consumption, bandwidth, necessary capacity and thermal differentials. The OS can then prioritize allocating pages to memory according to the user's preferences. For example, a user may specify a minimum power consumption and thermal mode where the OS will allocate pages only to zone 1, sacrificing performance as necessary to save energy and reduce hot spots. In an embodiment, the user can specify a mid-range allocation scheme. In this embodiment, the OS can allocate pages to zones 1 and 2, using more power than before and achieving better performance. The user can specify maximum performance at the expense of hot spot creation and power consumption allowing the OS to allocate to all available zones to maximize memory capacity and bandwidth.

In an embodiment, each workload request can include specified credentials including: time to completion, power and performance characteristics, number of threads, memory required, memory bandwidth required, and optimization objectives relating to power/performance/thermal differentials. The OS can queue the workload requests according the user's preferences and the workload credentials until all memory resources are committed. The workloads are deployed, and any remaining workloads queued, again according to the user's preferences, the thermal zone mapping, and the workload credentials, to achieve the user's desired objective(s) as indicated by their preferences.

In an embodiment, the user's preferences can define memory allocation policies set forth during the IPL. Changes to the user's setting, or changes made in view of workload credentials, are configured by executing the IPL of the application again (rebooting the application after changing the memory allocation settings according to the desired user objective and the thermal mapping). In an embodiment, a memory scrub is executed, capturing memory contents and consolidating pages of interest using secondary storage, and then restoring the contents according to the new allocation policies. In an embodiment, a swizzled memory swap is used to consolidate pages of interest in secondary memory, again restoring memory according to new allocation policies regarding power/performance and thermal settings.

FIG. 1 provides a schematic illustration of exemplary network resources associated with practicing the disclosed inventions. The inventions may be practiced in the processors of any of the disclosed elements which process an instruction stream. As shown in the figure, a networked Client device 110 connects wirelessly to server sub-system 102. Client device 104 connects wirelessly to server sub-system 102 via network 114. Client devices 104 and 110 comprise application program (not shown) together with sufficient computing resource (processor, memory, network communications hardware) to execute the program. As shown in FIG. 1, server sub-system 102 comprises a server computer 150. FIG. 1 depicts a block diagram of components of server computer 150 within a networked computer system 1000, in accordance with an embodiment of the present invention. It should be appreciated that FIG. 1 provides only an illustration of one implementation and does not imply any limitations with regard to the environments in which different embodiments can be implemented. Many modifications to the depicted environment can be made.

Server computer 150 can include processor(s) 154, memory 158, persistent storage 170, communications unit 152, input/output (I/O) interface(s) 156 and communications fabric 140. Communications fabric 140 provides communications between cache 162, memory 158, persistent storage 170, communications unit 152, and input/output (I/O) interface(s) 156. Communications fabric 140 can be implemented with any architecture designed for passing data and/or control information between processors (such as microprocessors, communications and network processors, etc.), system memory, peripheral devices, and any other hardware components within a system. For example, communications fabric 140 can be implemented with one or more buses.

Memory 158 and persistent storage 170 are computer readable storage media. In this embodiment, memory 158 includes random access memory (RAM) 160. In general, memory 158 can include any suitable volatile or non-volatile computer readable storage media. Cache 162 is a fast memory that enhances the performance of processor(s) 154 by holding recently accessed data, and data near recently accessed data, from memory 158.

Program instructions and data used to practice embodiments of the present invention, e.g., the machine learning program 175, are stored in persistent storage 170 for execution and/or access by one or more of the respective processor(s) 154 of server computer 150 via cache 162. In this embodiment, persistent storage 170 includes a magnetic hard disk drive. Alternatively, or in addition to a magnetic hard disk drive, persistent storage 170 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 170 may also be removable. For example, a removable hard drive may be used for persistent storage 170. Other examples include optical and magnetic disks, thumb drives, and smart cards that are inserted into a drive for transfer onto another computer readable storage medium that is also part of persistent storage 170.

Communications unit 152, in these examples, provides for communications with other data processing systems or devices, including resources of client computing devices 104, and 110. In these examples, communications unit 152 includes one or more network interface cards. Communications unit 152 may provide communications through the use of either or both physical and wireless communications links. Software distribution programs, and other programs and data used for implementation of the present invention, may be downloaded to persistent storage 170 of server computer 150 through communications unit 152.

I/O interface(s) 156 allows for input and output of data with other devices that may be connected to server computer 150. For example, I/O interface(s) 156 may provide a connection to external device(s) 190 such as a keyboard, a keypad, a touch screen, a microphone, a digital camera, and/or some other suitable input device. External device(s) 190 can also include portable computer readable storage media such as, for example, thumb drives, portable optical or magnetic disks, and memory cards. Software and data used to practice embodiments of the present invention, e.g., machine learning program 175 on server computer 150, can be stored on such portable computer readable storage media and can be loaded onto persistent storage 170 via I/O interface(s) 156. I/O interface(s) 156 also connect to a display 180.

Display 180 provides a mechanism to display data to a user and may be, for example, a computer monitor. Display 180 can also function as a touch screen, such as a display of a tablet computer.

Figure 2:
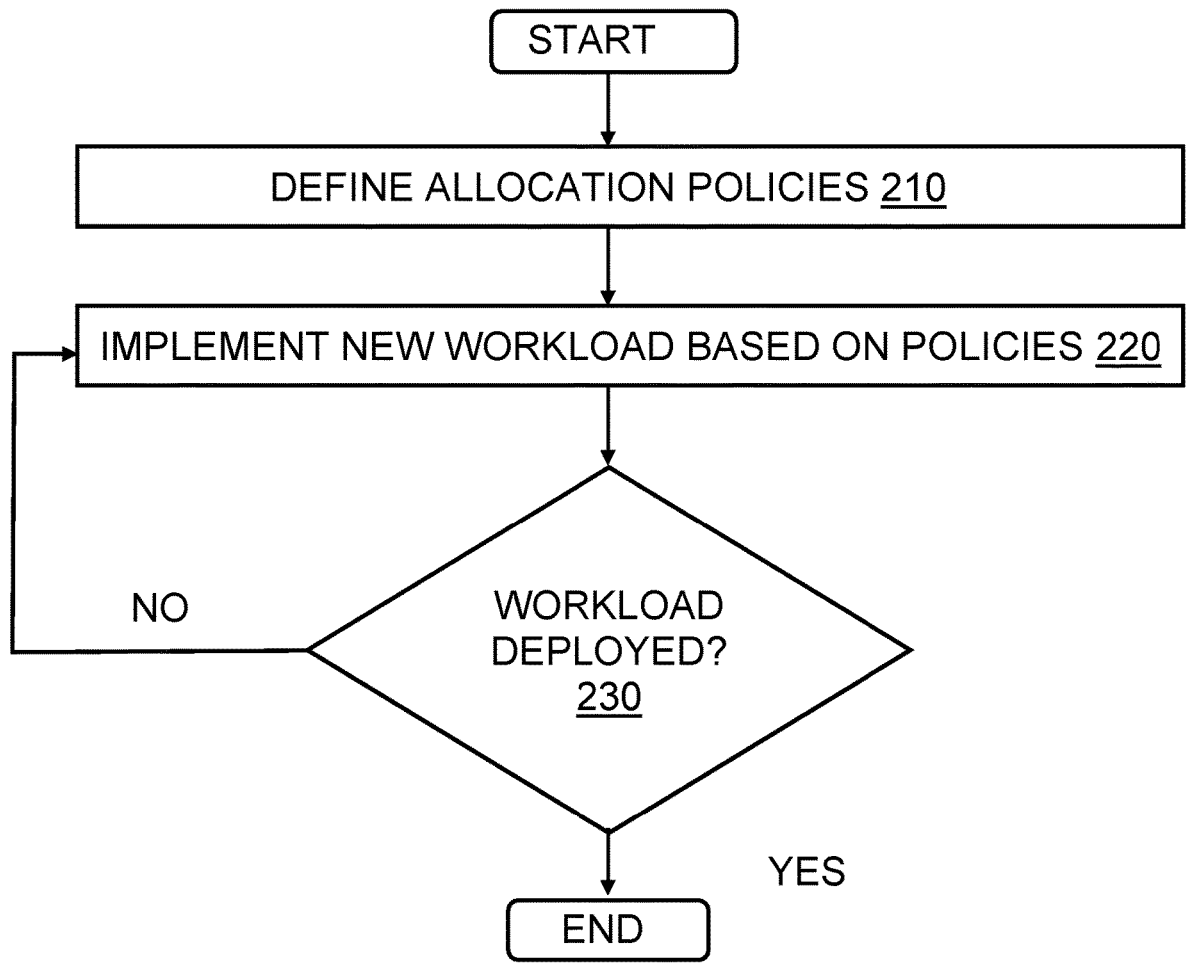
FIG. 2 provides a flowchart depicting an operational sequence, according to an embodiment of the invention.

FIG. 2 provides a flowchart 200, illustrating exemplary activities associated with the practice of the disclosure. After program start, Memory allocation policies are defined during the IPL for a program. The policies can be defined according to user settings including performance, power, and thermal settings. The thermal setting can be associated with a thermal mapping of the system memory. The thermal mapping can be created using MCBIST of the memory segments to simulate traffic to the memory. At 220, a workload request is implemented based upon the defined allocation policies of 210. At 230 the system checks the workload deployment. If deployment is complete the program of the method ends. If the deployment is not complete, the method returns to 220 to continue the workload deployment as before.

Figure 3:
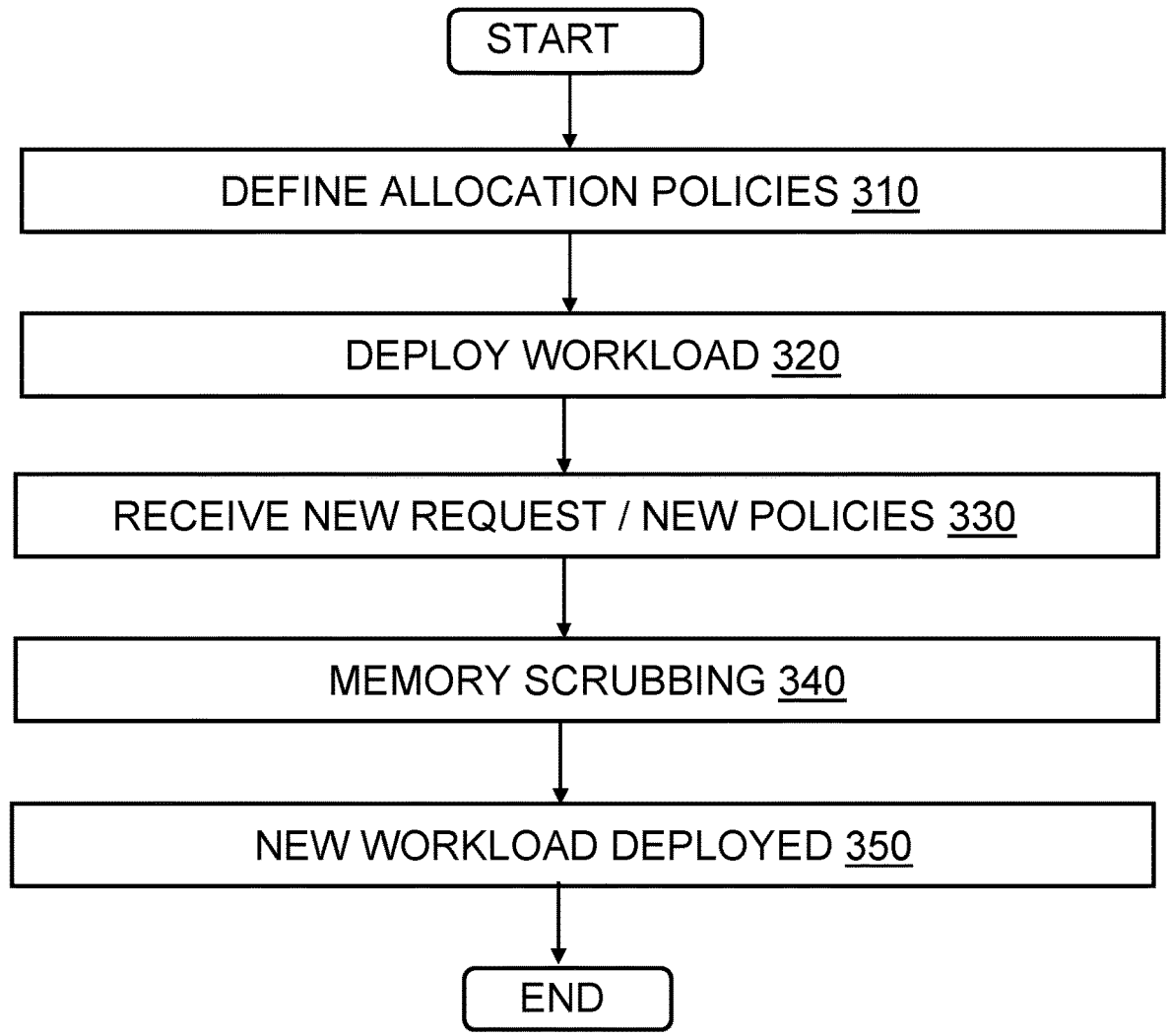
FIG. 3 provides a flowchart depicting an operational sequence, according to an embodiment of the invention.

As illustrated in flowchart 300 of FIG. 3, after program start, allocation policies are defined at 310 during application IPL. At 320, a workload is deployed according to the defined policies. At 330, a new workload request is received with different memory allocation policies. At 340, the memory is scrubbed, or flushed, and the new workload is deployed using the new policies at 350.

Figure 4:
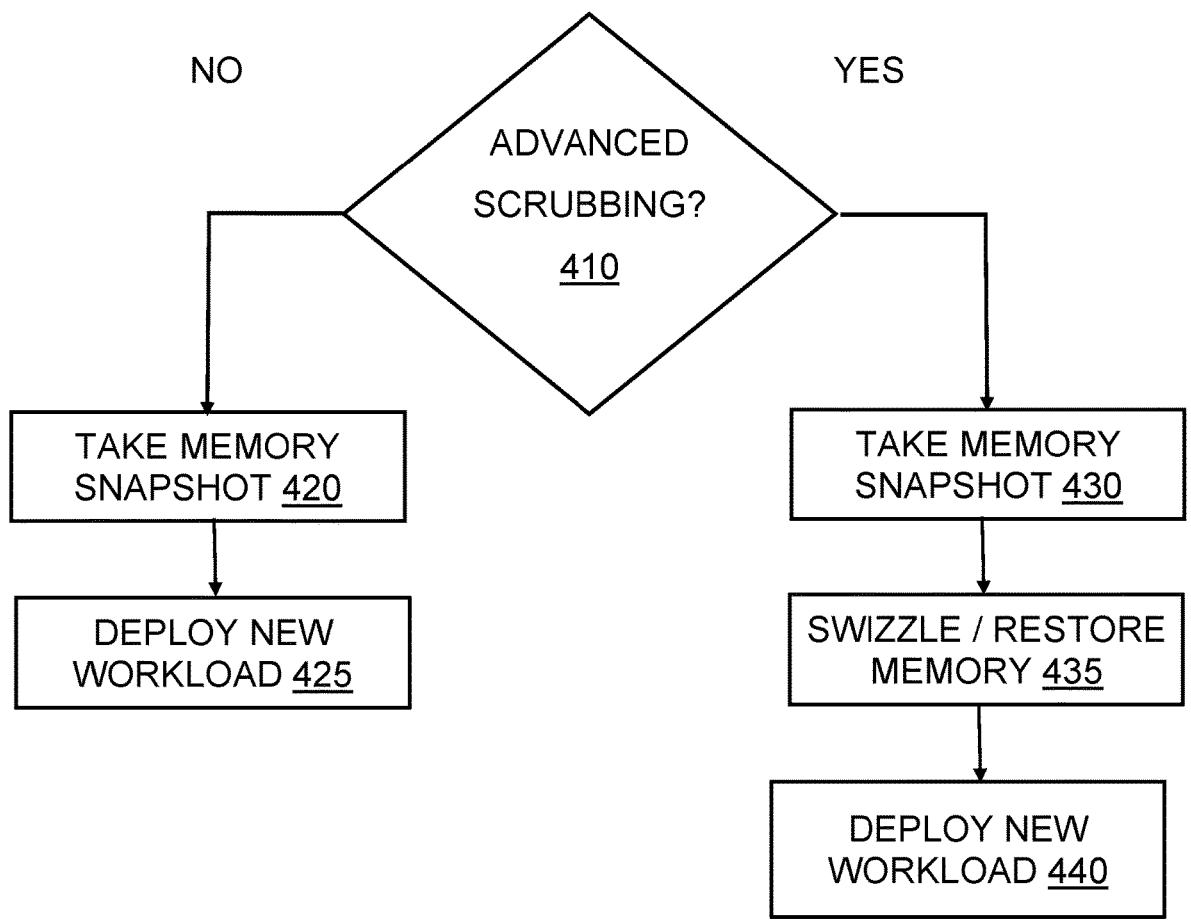
FIG. 4 provides a flowchart depicting an operational sequence, according to an embodiment of the invention.

As illustrated in flowchart 400 of FIG. 4, memory scrubbing can follow two paths. At 410 the system checks for a request for advanced scrubbing. At 420, basic scrubbing proceeds with the capture of a snapshot of memory contents into secondary memory. A new workload can then be deployed using new policy settings at 425 while preserving the previous memory snapshot. At 430, advanced scrubbing proceeds with a snapshot of current memory contents to secondary memory. The current contents are swizzled according to the new policies and restored to main memory at 435. The new workload is then deployed against the new policies at 440.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
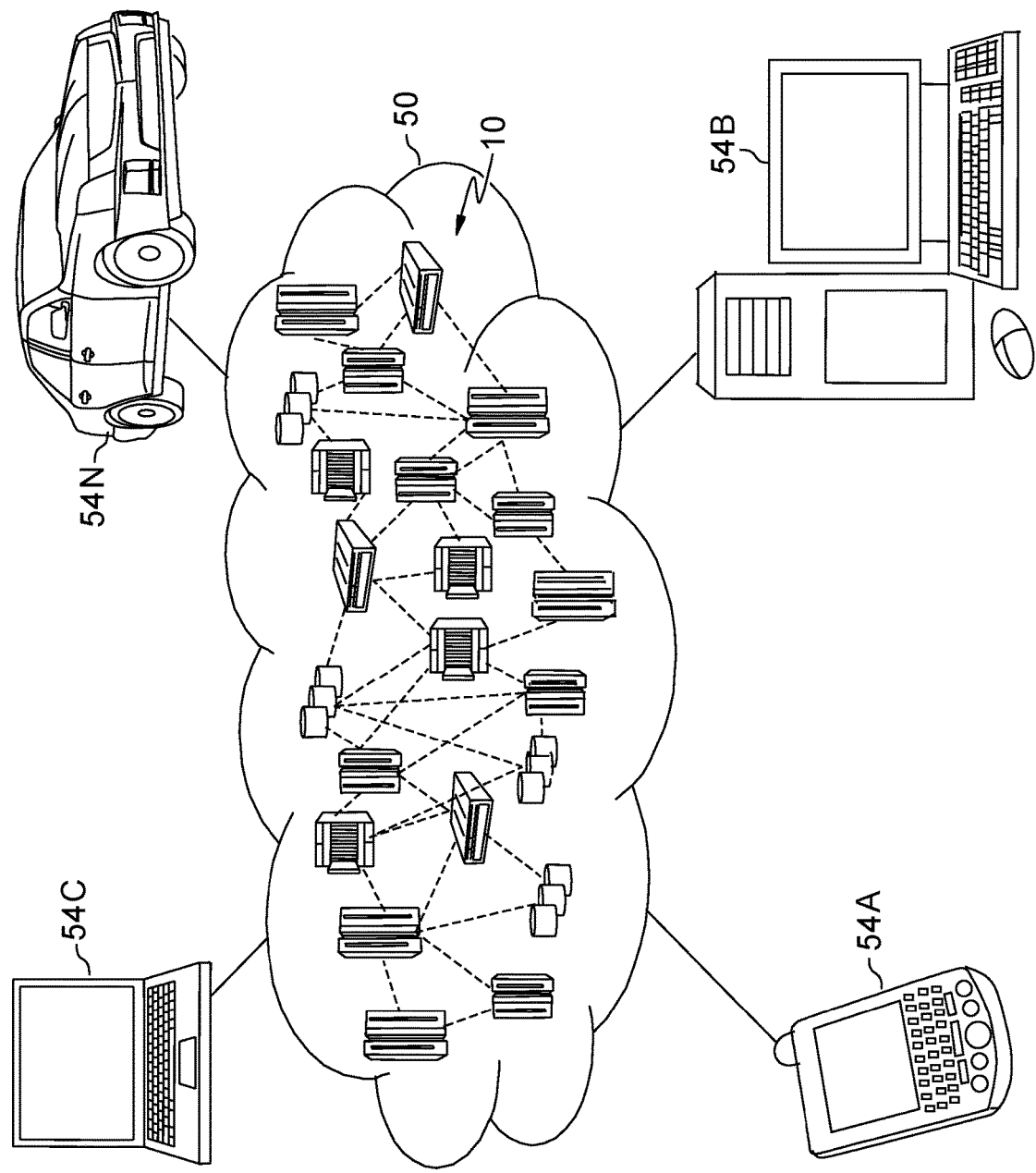
FIG. 5 depicts a cloud computing environment, according to an embodiment of the invention.

Referring now to FIG. 5, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
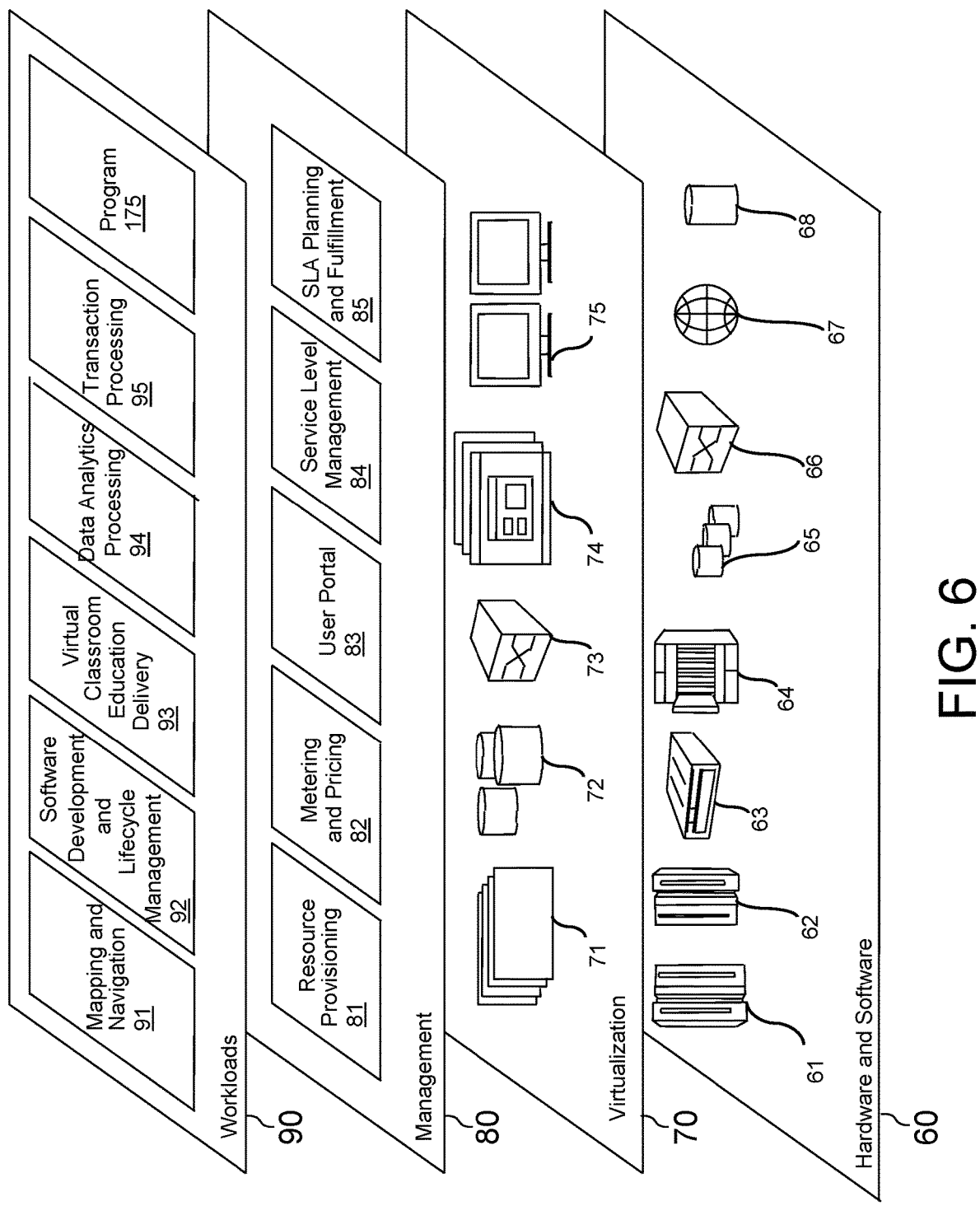
FIG. 6 depicts abstraction model layers, according to an embodiment of the invention.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and machine learning program 175.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer implemented method for managing memory allocation, the method comprising:
    defining a new memory segment policy according to power, performance, and thermal requirements by:
        generating data traffic for a first memory segment;
        concurrently generating data traffic for other memory segments;
        measuring memory segment temperatures while generating data traffic for the first memory segment;
        defining a plurality of thermal zones across a set of memory segments; and
        allocating memory requests across the set of memory segments according to the plurality of thermal zones;
    selecting the new memory segment policy;
    capturing a current content of the set of memory segments to secondary memory;
    mixing the current content according to the new memory segment policy yielding mixed content;
    storing the mixed content in the set of memory segments;

implementing system workload according to the new memory segment policy; and deploying the system workload against the new memory segment policy.

2. The computer implemented method according to claim 1, wherein generating traffic for the first memory segment comprises, using a memory-controller-built-in-self-test (MCBIST) routine during an initial program load (IPL) sequence.

3. The computer implemented method according to claim 1, wherein measuring the memory segment temperatures while generating data traffic for the first memory segment comprises measuring memory segment temperatures associated with minimum, average, and maximum, cooling system air-flow.

4. The computer implemented method according to claim 1, wherein generating data traffic for the first memory segment comprises generating mixed rank data traffic for the first memory segment.

5. The computer implemented method according to claim 1, further comprising:
defining a memory segment real address space according to the thermal zones.

6. The computer implemented method according to claim 1, wherein defining memory segment policies according to power, performance, and thermal requirements further comprises:
defining maximum allowable temperature differences between adjacent memory segment portions.

7. A computer program product for managing application execution, the computer program product comprising one or more computer readable storage medium and program instructions stored on the one or more computer readable storage medium, the stored program instructions comprising:
program instructions for defining a new memory segment policy according to power, performance, and thermal requirements, wherein the program instructions for defining the memory segment policy according to the power and thermal requirements comprise:
program instructions for generating data traffic for a first memory segment;
program instructions for concurrently generating data traffic for other memory segments;
program instructions for measuring memory segment temperatures while generating data traffic for the first memory segment;
program instructions for defining a plurality of thermal zones across a set of memory segments; and
program instructions for allocating memory requests across the set of memory segments according to the plurality of thermal zones;
program instructions for selecting the new memory segment policy;
program instructions for capturing a current content of the set of memory segments to secondary memory;
program instructions for mixing the current content according to the new memory segment policy yielding mixed content;
program instructions for storing the mixed content in the set of memory segments;
program instructions for implementing system workload according to the new memory segment policy; and
program instructions for deploying the system workload against the new memory segment policy.

8. The computer program product according to claim 7, wherein program instructions for generating traffic for the first memory segment comprise, program instructions for using a memory-controller-built-in-self-test (MCBIST) routine during an initial program load (IPL) sequence.

9. The computer program product according to claim 7, wherein program instructions for measuring the memory segment temperatures while generating data traffic for the first memory segment comprise program instructions for measuring memory segment temperatures associated with minimum, average, and maximum, cooling system air-flow.

10. The computer program product according to claim 7, wherein program instructions for generating data traffic for the first memory segment comprise program instructions generating mixed rank data traffic for the first memory segment.

11. The computer program product according to claim 7, the stored program instructions further comprising:
program instructions for defining a memory segment real address space according to the thermal zones.

12. The computer program product according to claim 7, wherein program instructions defining memory segment policies according to power, performance, and thermal requirements further comprise:
program instructions for defining maximum allowable temperature differences between adjacent memory segment portions.

13. A computer system for managing application execution, the computer system comprising:
one or more computer processors;
one or more computer readable storage medium;
program instructions stored on the one or more computer readable storage medium for execution by the one or more computer processor, the program instructions comprising:
program instructions for defining a new memory segment policy according to power, performance, and thermal requirements, wherein the program instructions for defining the new memory segment policy according to the power and the thermal requirements comprise:
program instructions for generating data traffic for a first memory segment;
program instructions for concurrently generating data traffic for other memory segments;
program instructions for measuring memory segment temperatures while generating data traffic for the first memory segment;
program instructions for defining a plurality of thermal zones across a set of memory segments; and
program instructions for allocating memory requests across the set of memory segments according to the plurality of thermal zones;
program instructions for selecting the new memory segment policy;
program instructions for capturing a current content of the set of memory segments to secondary memory;
program instructions for mixing the current content according to the new memory segment policy yielding mixed content;
program instructions for storing the mixed content in the set of memory segments;
program instructions for implementing system workload according to the new memory segment policy; and
program instructions for deploying the system workload against the new memory segment policy.

14. The computer system according to claim 13, wherein program instructions for generating traffic for the first memory segment comprise, program instructions for using a memory-controller-built-in-self-test (MCBIST) routine during an initial program load (IPL) sequence.

15. The computer system according to claim 13, wherein program instructions for measuring the memory segment temperatures while generating data traffic for the first memory segment comprise program instructions for measuring memory segment temperatures associated with minimum, average, and maximum, cooling system air-flow.

16. The computer system according to claim 13, the stored program instructions further comprising:
   program instructions for defining a memory segment real address space according to the thermal zones.

17. The computer system according to claim 13, wherein program instructions defining memory segment policies according to power, performance, and thermal requirements further comprise:
   program instructions for defining maximum allowable temperature differences between adjacent memory segment portions.

* * * * *